US012693358B2

(12) United States Patent
Shibuya et al.

(10) Patent No.: US 12,693,358 B2
(45) Date of Patent: Jul. 28, 2026

(54) MRI APPARATUS

(71) Applicant: Canon Kabushiki Kaisha, Tokyo (JP)

(72) Inventors: Takehiro Shibuya, Nasushiobara (JP);
Hiromi Kawamoto, Yaita (JP);
Sadanori Tomiha, Nasushiobara (JP);
Misaki Hattaha, Sakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 83 days.

(21) Appl. No.: 18/453,372

(22) Filed: Aug. 22, 2023

(65) Prior Publication Data

US 2024/0077556 A1     Mar. 7, 2024

(30) Foreign Application Priority Data

Sep. 6, 2022     (JP) ................................. 2022-141428

(51) Int. Cl.
G01R 33/3815 (2006.01)
G01R 33/38 (2006.01)
G01R 33/54 (2006.01)

(52) U.S. Cl.
CPC ..... G01R 33/3815 (2013.01); G01R 33/3804 (2013.01); G01R 33/543 (2013.01)

(58) Field of Classification Search
CPC ............ G01R 33/3815; G01R 33/3804; G01R 33/543; G01R 33/307; G01R 33/34007; G01R 33/3858; G01R 33/3873; G01R 33/3875; G01R 33/56509; G01R 33/56563; G01R 33/385; G01R 33/48; A61B 5/055
See application file for complete search history.

(56) References Cited

U.S. PATENT DOCUMENTS

| | | | |
|---|---|---|---|
| 2009/0219121 A1* | 9/2009 | Atkins | H01F 6/008 |
| | | | 335/216 |
| 2011/0037467 A1 | 2/2011 | Tsuda | |
| 2014/0043028 A1 | 2/2014 | Blakes | |
| 2016/0341805 A1* | 11/2016 | Havens | G01R 33/3875 |

(Continued)

FOREIGN PATENT DOCUMENTS

| | | | |
|---|---|---|---|
| EP | 0145940 A1 * | 6/1985 | H01F 6/006 |
| JP | 2004-529692 A | 9/2004 | |
| JP | 2006-326177 A | 12/2006 | |

(Continued)

OTHER PUBLICATIONS

Coombs, Superconducting flux pumps, J. Appl. Phys. 125, 230902, 2019 (Year: 2019).*

(Continued)

*Primary Examiner* — Daniel R Miller
(74) *Attorney, Agent, or Firm* — Oblon, McClelland, Maier & Neustadt, L.L.P.

(57) ABSTRACT

In one embodiment, an MRI apparatus includes: a static magnet provided with a superconducting coil and configured to generate a static magnetic field having static magnetic field distribution in an open space outside the superconducting coil; control circuitry configured to adjust the static magnetic field distribution; and a reconstruction processing circuit configured to generate a magnetic resonance image on the basis of magnetic resonance signals emitted from an object that is at least partially placed in the open space outside the superconducting coil.

13 Claims, 9 Drawing Sheets

FLOOR SURFACE

(56) References Cited

U.S. PATENT DOCUMENTS

| | | |
|---|---|---|
| 2022/0113361 A1 | 4/2022 | Nacev et al. |
| 2022/0229130 A1 | 7/2022 | Hattaha et al. |

FOREIGN PATENT DOCUMENTS

| | | | |
|---|---|---|---|
| JP | 2011-82229 A | 4/2011 | |
| JP | 2022-521391 A | 4/2022 | |
| WO | WO-2005081008 A2 * | 9/2005 | ......... G01R 33/3875 |

OTHER PUBLICATIONS

Partial European Search Report Issued Feb. 1, 2024 in European Application 23194660.9, 13 pages.
Office Action issued Mar. 24, 2026, in corresponding European Patent Application No. 23194660.9, 7 pages.
Office Action issued Mar. 24, 2026, in corresponding Japanese Patent Application No. 2022-141428, 4 pages.

* cited by examiner

FIG. 9

MRI APPARATUS

CROSS-REFERENCE TO RELATED APPLICATION

This application is based upon and claims the benefit of priority from Japanese Patent Application No. 2022-141428, filed on Sep. 6, 2022, the entire contents of which are incorporated herein by reference.

TECHNICAL FIELD

Disclosed Embodiments relate to a magnetic resonance imaging (MRI) apparatus.

BACKGROUND

An MRI apparatus is an imaging apparatus that magnetically excites nuclear spin of an object placed in a static magnetic field by applying a radio frequency (RF) signal having the Larmor frequency and reconstructs an image on the basis of magnetic resonance (MR) signals emitted from the object due to the excitation.

Many MRI apparatuses have a configuration called a gantry in which a cylindrical space called a bore is formed. An object (for example, a patient) lying on a table (i.e., top plate) is imaged while being carried into the cylindrical space. Inside the gantry, a cylindrical static magnetic field magnet, a cylindrical gradient coil, and a transmitting/receiving coil (i.e., WB (Whole Body) coil) are housed. In many conventional MRI apparatus of this structure, the static magnetic field magnet, the gradient coil, and the RF coil are cylindrical, so the MRI apparatus having this structure will be hereinafter referred to as a cylindrical MRI apparatus.

In the cylindrical MRI apparatus, imaging is performed in the closed space in the bore, and thus, imaging may be difficult for some patients having claustrophobia, for example.

In another structure of MRI apparatus having been developed, for example, two static magnetic field magnets and the gradient coil are formed in the shape of a flat plate so that imaging of the object such as a patient is performed in the open space sandwiched between the two tabular static magnetic field magnets. Hereinafter, an MRI apparatus having this structure will be referred to as a planar open magnet MRI system or an open-magnet MRI apparatus. In the open-magnet MRI apparatus, imaging is performed in the open space, and thus, even a patient having claustrophobia can be imaged.

The cylindrical MRI apparatus is premised on imaging in a narrow space with high magnetic-field uniformity inside the bore, whereas the open-magnet MRI apparatus images the object in a relatively wide open space. Thus, in the open-magnet MRI apparatus, the position of the object with respect to the static magnetic field magnets is not necessarily fixed.

Imaging using an MRI apparatus requires a relatively long time and the object is exposed to a noisy environment. Hence, for example, in the case of imaging a child and/or an elderly person in a wide open space, there is a high possibility that the object moves during imaging and an artifact ascribable to the body motion is included in the image.

In addition, depending on the pathological condition of the patient, it may be difficult for the patient to lie face-up on the table. In such a case, there is a demand to enable imaging in an arbitrary or free posture depending on the pathological condition of the patient. However, in order to meet such a demand, it is necessary to be able to freely adjust the position and range of the imaging region depending on the pathological condition of the patient.

BRIEF DESCRIPTION OF THE DRAWINGS

In the accompanying drawings:

FIG. 9 is a schematic diagram illustrating a configuration of an MRI apparatus according to the second embodiment.

DETAILED DESCRIPTION

Hereinbelow, embodiments of the present invention will be described by referring to the accompanying drawings.

In one embodiment, an MRI apparatus includes: a static magnet provided with a superconducting coil and configured to generate a static magnetic field having static magnetic field distribution in an open space outside the superconducting coil; control circuitry configured to adjust the static magnetic field distribution; and a reconstruction processing circuit configured to generate a magnetic resonance image on the basis of MR signals emitted from an object that is at least partially placed in the open space outside the superconducting coil.

First Embodiment

Figure 1:
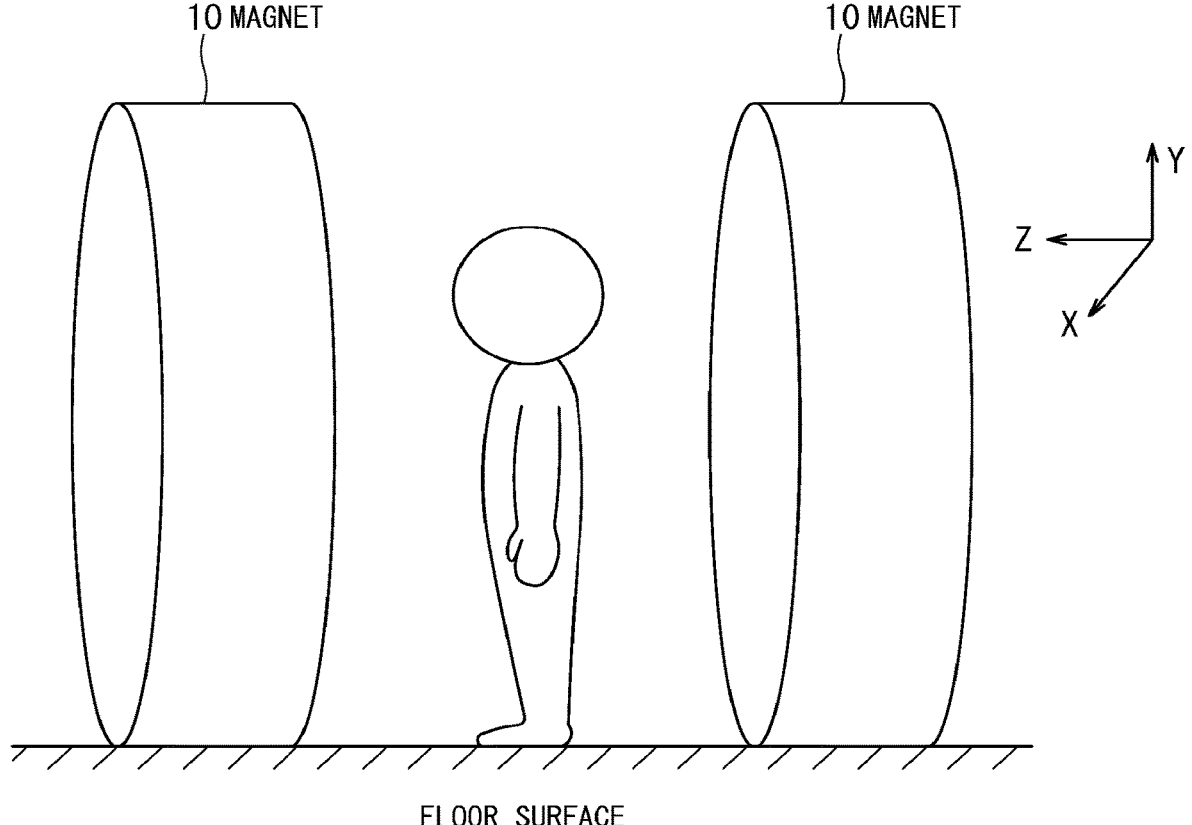
FIG. 1 is a schematic diagram illustrating a first configuration of an MRI apparatus according to one embodiment.

FIG. 1 illustrates a first configuration of an open magnet MRI apparatus 1 according to one embodiment. As shown in FIG. 1, the MRI apparatus 1 has, for example, two static magnetic field magnets 10 (hereinafter shortly referred to as the magnets 10) in the shape of a circular flat plate, i.e., a pair of thin cylindrical magnets 10.

The respective magnets 10 are arranged such that the central axis of each magnet 10 (i.e., the axis passing through the center of both circular end faces of the cylindrical shape) is parallel to, for example, the floor surface. In addition, the two magnets 10 are arranged so as to sandwich the object such as a human body or a patient. This arrangement of the magnets 10 generates a magnetic field in the open space between the two magnets 10. The object is imaged in this open space, for example, in a standing position.

Figure 2:
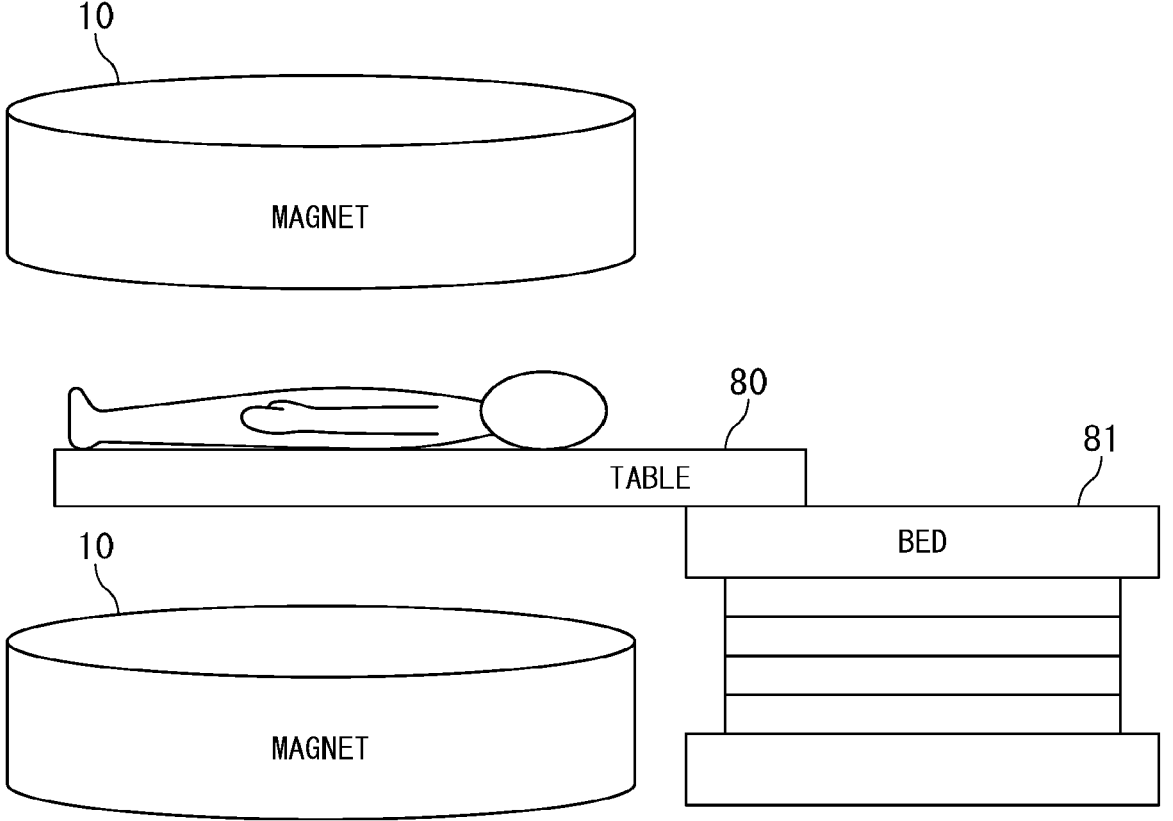
FIG. 2 is a schematic diagram illustrating a second configuration of an MRI apparatus according to the embodiment.

FIG. 2 illustrates a second configuration of the open magnet MRI apparatus 1. FIG. 1 illustrates a configuration of imaging an object in a standing position, whereas FIG. 2 illustrates a configuration of imaging an object on a table 80 of a bed 81 in a lying position. When imaging an object in the lying position, the two magnets 10 are arranged such that their central axes are in the vertical direction as shown in FIG. 2, and, for example, one magnet 10 is disposed below the table 80 and the other magnet 10 is disposed above the table 80.

As shown in FIG. 1 and FIG. 2, in the imaging using the magnets 10 of the embodiment, the object can be imaged in an open magnetic field space, and thus, even a patient having claustrophobia can be imaged, for example.

Although each of FIG. 1 and FIG. 2 illustrates a situation in which whole of the object is placed and imaged in the open space outside the magnets 10 including superconducting coils, at least a part of the object may be placed and imaged in an open space outside the superconducting coils. The open space is a space that is adjacent to the superconducting coil and in which the static magnetic field is formed.

Figure 3:
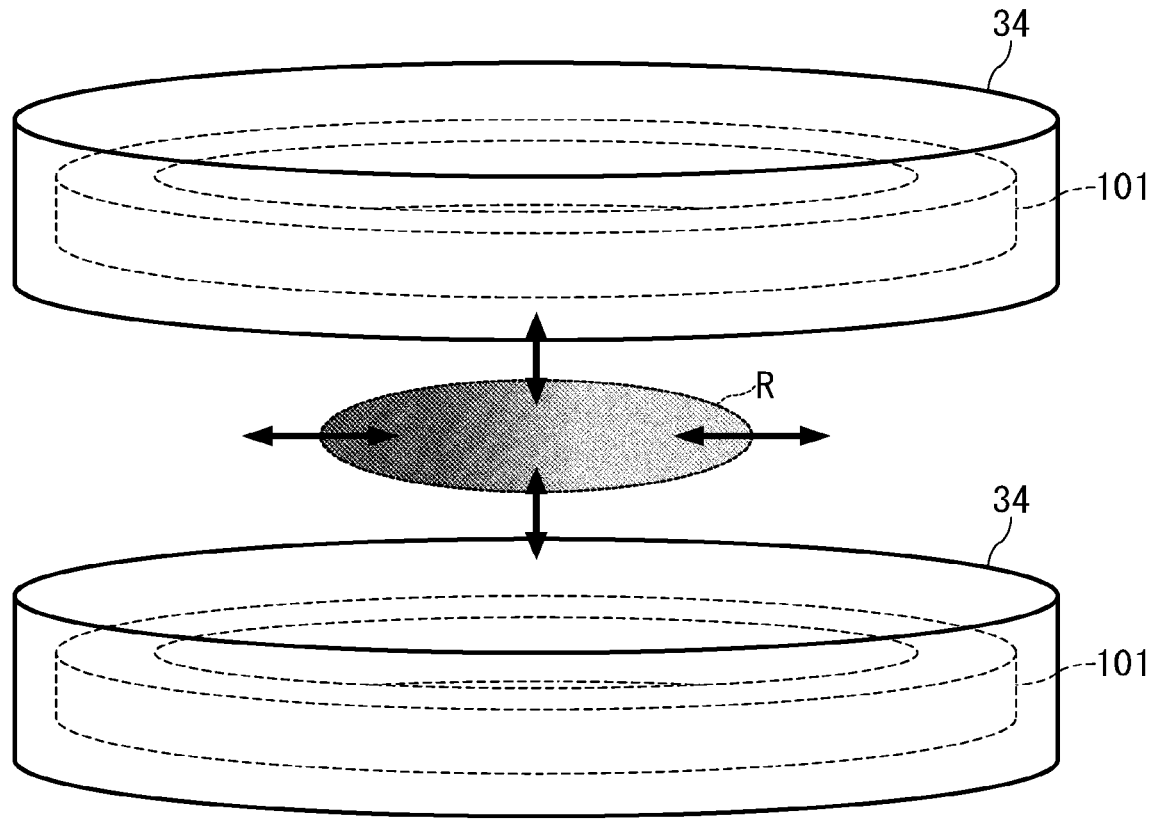
FIG. 3 is a schematic diagram illustrating a configuration of static magnetic field magnets.

FIG. 3 is a schematic diagram illustrating a configuration of the magnet 10. Each magnet 10 includes the superconducting coil 101 in its inside. The magnet 10 generates a static magnetic field by applying an electric current from the magnet power supply 40 (see FIG. 4 and FIG. 6) to the superconducting coil 101 in the excitation mode. Afterward, when the magnet 10 shift to the persistent current mode, the magnet power supply 40 is disconnected. Once the magnet 10 shift to the persistent current mode, the magnet 10 continue to generate a strong static magnetic field for a long time, for example, over one year.

The magnet 10 can also be driven under an operation mode in which electric currents are continuously applied from the magnet power supply 40 to the superconducting coil 101 even during the operation time including an imaging time without disconnecting the magnet power supply 40. This operation mode is hereinafter referred to as the control current mode.

The MRI apparatus 1 of the present embodiment is configured in such a manner that the position and shape of static magnetic field distribution in an imaging region R are changeable and adjustable in both the persistent current mode and the control current mode, as schematically shown by arrows in FIG. 3.

Figure 4:
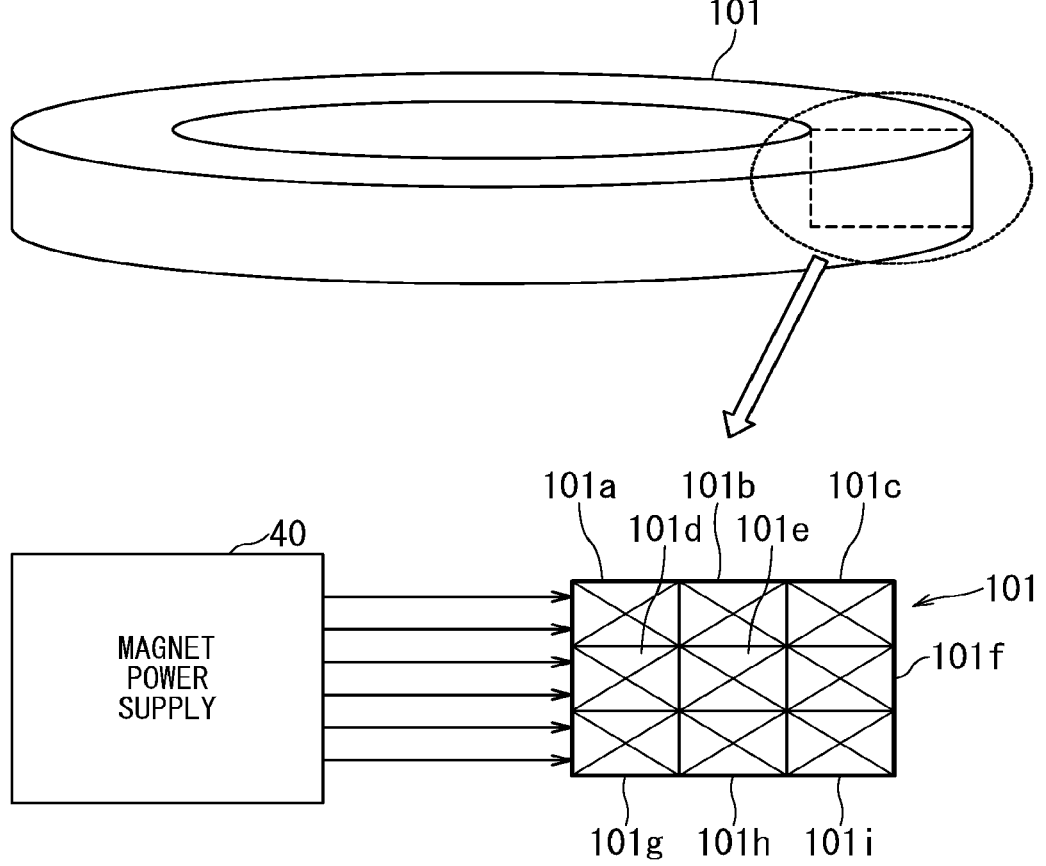
FIG. 4 is a schematic diagram illustrating respective configurations of a superconducting coil provided in the MRI apparatus of the embodiment and a magnet power supply to be connected to this superconducting coil.

FIG. 4 is a schematic diagram illustrating a configuration of the superconducting coil 101 provided in the MRI apparatus 1 of the embodiment and a configuration of the magnet power supply 40 connected to the superconducting coil 101. The superconducting coil 101 of the embodiment is divided into a plurality of segments as shown in the lower part of FIG. 4.

In an example shown in FIG. 4, the superconducting coil 101 is divided into nine segments 101$a$, 101$b$, 101$c$, 101$d$, 101$e$, 101$f$, 101$g$, 101$h$, and 101$i$.

In other words, the superconducting coil 101 is divided into a plurality of segments, and each segment has a superconducting subcoil (hereinafter shortly referred to as the subcoil) that is independent of the other segments.

The subcoil of each segment can be configured as, for example, a multifilamentary wire structure in which superconducting wires such as niobium titanium (Nb—Ti) superconducting wires or a rare-earth-based or bismuth-based high-temperature superconducting wires are formed into a large number of thin filaments or thin tapes, and are embedded in a normal-conducting base material such as copper. Each superconducting coil 101 configured as an assembly of these segments is submerged in a liquid helium container (not shown) filled with liquid helium, for example.

The subcoils of the respective segments are connected to the magnet power supply 40 in parallel with each other, and can be configured to individually receive independent current supply from the magnet power supply 40. The strength of the static magnetic field generated by the superconducting coils 101 and the shape, size, and position of the static magnetic field distribution can be adjusted as desired by independently (individually) controlling the magnitude and direction of the current values applied to the respective subcoils from the magnet power supply 40 and/or ON/OFF of these electric currents.

Among the plurality of segments included in superconducting coil 101, the subcoils of some of the segments may be independently connected in parallel with the magnet power supply 40 as described above, and the subcoils of the remaining segments may be connected in series, and the subcoils connected in series may be connected with the magnet power supply 40 by two ends. In this case, the number of groups of the plurality of subcoils connected in series may be one, two, or more.

In the aspect shown in FIG. 4, electric currents are applied from the magnet power supply 40 through six feeder lines to the nine segments 101$a$, 101$b$, 101$c$, 101$d$, 101$e$, 101$f$, 101$g$, 101$h$, and 101$i$ that constitute the superconducting coil 101. In this case, for example, the four segments 101$a$, 101$b$, 101$c$, and 101$d$ can be configured to receive independent current supply in parallel by four feeder lines. The segments 101$e$ and 101$f$ are connected in series to form a first series group, and the three segments 101$g$, 101$h$ and 101$i$ are also connected in series to form a second series group. Thus, the superconducting coil 101 can be configured such that the remaining two feeder lines of the magnet power supply 40 supply electric currents to the respective first and second series groups.

The magnitude and direction of the electric current applied by the magnet power supply 40 to each segment of the superconducting coil 101 may be controlled by the magnet power supply 40 itself or by control circuitry 42 (FIG. 6) connected to the magnet power supply 40.

Figure 5:
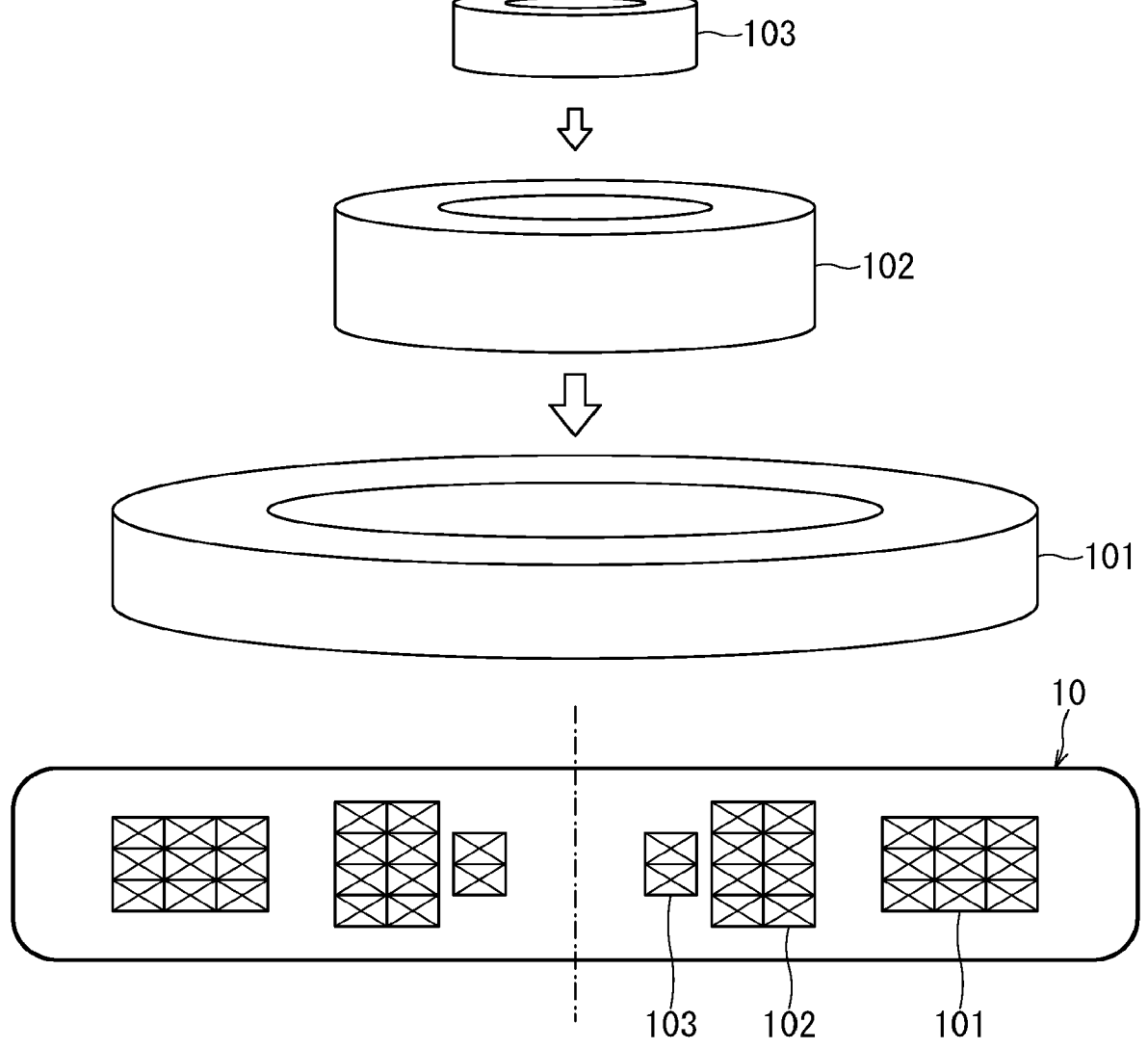
FIG. 5 is a schematic diagram illustrating a configuration in which the static magnetic field magnet has three superconducting coils.

Although each of FIG. 3 and FIG. 4 illustrates a configuration in which the magnet 10 includes one superconducting coil 101, the magnet 10 can be configured to include a plurality of superconducting coils. FIG. 5 illustrates a configuration in which the magnet 10 has three superconducting coils 101, 102, and 103. In the aspect shown in FIG. 5, three annular superconducting coils 101 to 103 with different diameters are coaxially arranged.

Each of the three superconducting coils 101 to 103 is divided into two or more segments. In the example shown in FIG. 5, the superconducting coil 101 is divided into nine segments as shown in FIG. 4, the superconducting coil 102 is divided into eight segments, and the superconducting coil 103 is divided into two segments.

By independently controlling the magnitude and direction of the current values applied to the respective subcoils of not only the superconducting coil 101 but also the superconducting coils 102 and 103, or by independently controlling ON/OFF of these electric currents, the strength of the static magnetic field generated by the magnets 10 as a whole, and the shape, size, and position of the static magnetic field distribution can be adjusted with a higher degree of freedom.

Figure 6:
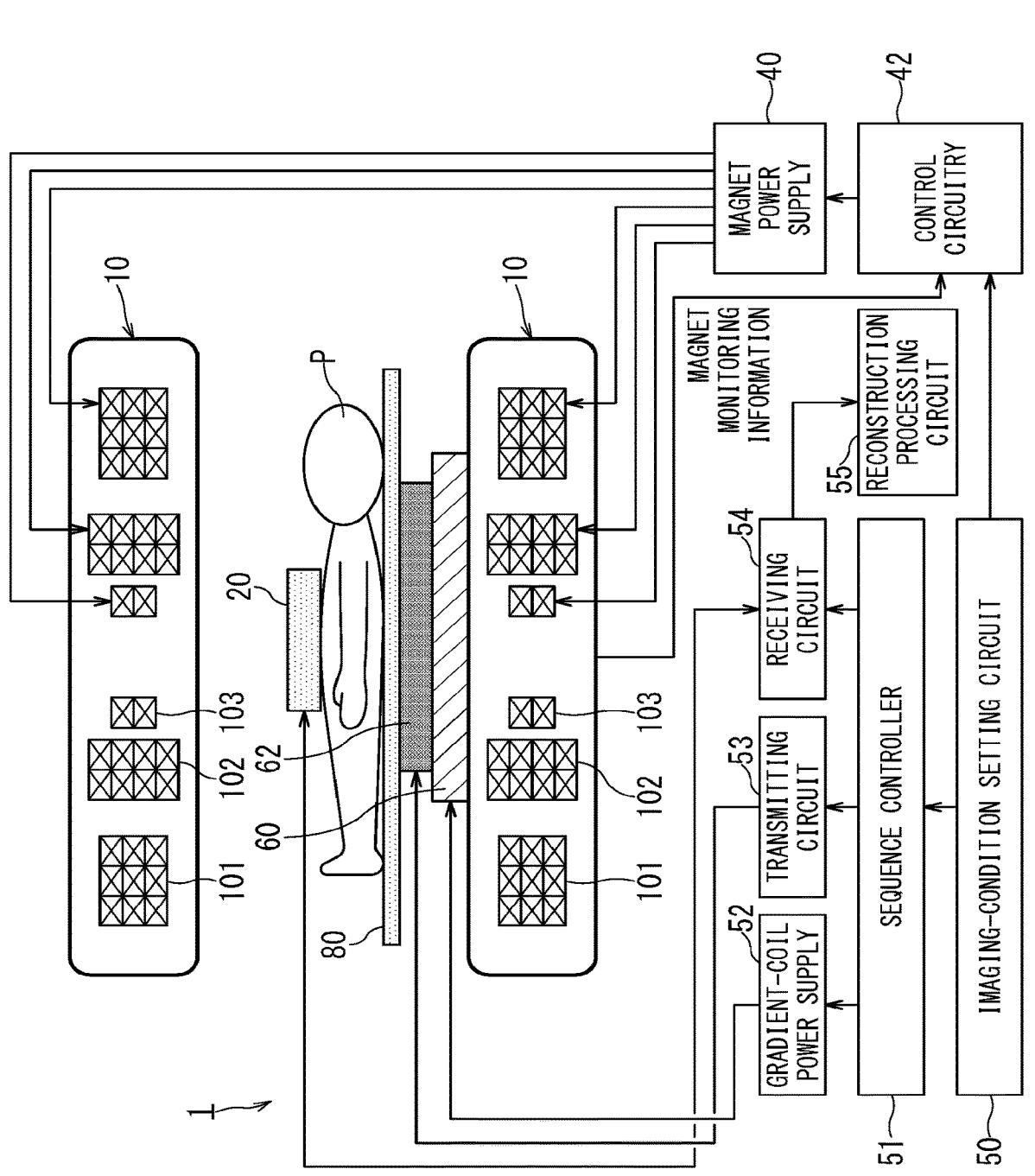
FIG. 6 is a schematic diagram illustrating a configuration of the MRI apparatus according to the first embodiment.

FIG. 6 illustrates a configuration of the MRI apparatus 1 according to the first embodiment in which the two magnets shown in FIG. 5 are arranged above and below the recumbent object P. The imaging region R, i.e., FOV (Field of View) is formed between the two magnets 10.

The MRI apparatus 1 shown in FIG. 6 includes the above-described two magnets 10, the table 80 on which the object P lies, a local coil 20 (i.e., surface coil) to be disposed near the object, a gradient coil 60, and an RF (Radio Frequency) coil 62.

In addition, the MRI apparatus 1 includes a magnet power supply 40, control circuitry 42; an imaging-condition setting circuit 50, a sequence controller 51; a gradient-coil power supply 52, a transmitting circuit 53 a receiving circuit 54, and a reconstruction processing circuit 55.

The imaging-condition setting circuit 50 sets and/or selects imaging conditions such as the type of pulse sequence and various parameter values, which are inputted via a user interface (not shown), for the sequence controller 51.

The sequence controller 51 performs a scan of the object by driving the gradient-coil power supply 52 and the transmitting circuit 53 based on the selected imaging conditions. The gradient-coil power supply 52 applies a gradient-magnetic-field current to the gradient coil 60 based on a drive signal from the sequence controller 51.

The transmitting circuit 53 generates RF pulses based on the drive signal from the sequence controller 51, and applies the RF pulses to the RF coil 62. The local coil 20 receives MR signals emitted from the object P in response to application of the RF pulses. The MR signals received by the local coil 20 are converted from analog signals into digital signals by the receiving circuit 54. The MR signals converted into the digital signals are inputted as k-space data into the reconstruction processing circuit 55. The recon-struction-processing circuit 55 generates a magnetic reso-nance image by performing reconstruction processing such as inverse Fourier transform on the k-space data.

As described above, the magnet power supply 40 applies an electric current to each of the superconducting coils 101 to 103 of the upper and lower magnets 10 under the control of the control circuitry 42. Although one feeder line for current supply is illustrated in FIG. 6 for each of the superconducting coils 101 to 103 in order to avoid compli-cation, a plurality of feeder lines for current supply are actually provided for each of the superconducting coils 101 to 103. This wiring enables individual and independent current-control for the respective subcoils of the plurality of segments in each of the superconducting coils 101 to 103.

The control circuitry 42 can adjust the static magnetic field distribution by independently controlling at least one of the direction and magnitude of the electric currents flowing through the respective segments of each of the supercon-ducting coils 101 to 103, as described above.

For example, in all or any one or two of the supercon-ducting coils 101 to 103, the static magnetic field distribu-tion may be adjusted by dividing the plurality of segments into a first group and a second group, and applying electric currents in opposite directions between one or more first subcoil(s) in the first group and one or more second subcoil (s) in the second group.

Instead of or in addition to the independent control of the electric currents between the segments, the static magnetic field distribution can also be adjusted by independently controlling at least one of the direction and magnitude of the electric currents applied to the respective superconducting coils 101 to 103.

The operation mode of the electric currents applied from the magnet power supply 40 to the superconducting coils 101 to 103 may be any one of a persistent current mode and a control current mode.

The persistent current mode is a current operation mode in which the electric currents supplied to the superconduct-ing coils 101 to 103 are increased from zero to a predeter-mined value and then the superconducting coils 101 to 103 continue to be supplied with the electric currents in the state of being disconnected from the magnet power supply 40. The transient operation mode in which the electric currents to be applied to the superconducting coils 101 to 103 increase from zero to the predetermined value is referred to as an excitation mode.

In the persistent current mode, the direction and magni-tude of the electric currents flowing through the supercon-ducting coils 101 to 103 and the respective segments are determined in advance at the start of the excitation mode, and are then fixed after the magnets 10 shift to the persistent current mode.

The control current mode is a current operation mode in which electric currents are continuously applied from the magnet power supply 40 to the superconducting coils 101 to 103 even during the operation time including an imaging time without disconnecting the magnet power supply 40. The direction and magnitude of the electric currents applied to the superconducting coils 101 to 103 and the respective segments in the control current mode can be changed at a desired timing both before imaging and during imaging.

As to the current operation mode where the electric currents are applied from the magnet power supply 40 to the superconducting coils 101 to 103, either the persistent current mode or the control current mode may be assigned to all the superconducting coils 101 to 103 and all the segments. Alternatively, the persistent current mode and the control current mode may be mixed and assigned to the plurality of superconducting coils 101 to 103 or the plurality of segments.

As described above, the static magnetic field distribution can be adjusted by causing the control circuitry 42 to control the electric currents to be applied by the magnet power supply 40. At least one of the position of the imaging region of the object, the range of the imaging region of the object, and the strength of the static magnetic field can be adjusted by adjusting the static magnetic field distribution, i.e., by changing the shape and/or position of the static magnetic field distribution.

In addition, the control circuitry 42 may acquire the imaging conditions from the imaging-condition setting cir-cuit 50 so as to adjust the static magnetic field distribution based on the acquired imaging conditions. In this case, the imaging conditions to be acquired include, for example, at least one of the position of the imaging region of the object, the range of the imaging region of the object, and the strength of the static magnetic field, and the control circuitry 42 determines the electric currents to be applied to the respective segments of the superconducting coils 101 to 103 for obtaining the desired static magnetic field distribution based on the acquired imaging conditions.

The control circuitry 42 may store a lookup table in which imaging conditions, such as the position of the imaging region, the range of the imaging region of the object, and the strength of the static magnetic field, are associated with electric currents to be supplied to the respective segments of the superconducting coils 101 to 103 for obtaining the static magnetic field distributions corresponding to these imaging conditions, for example. The control circuitry 42 can determine the electric currents to be supplied to the respective segments based on the imaging conditions set in the imaging-condition setting circuit 50 by referring to this lookup table.

Figure 7:
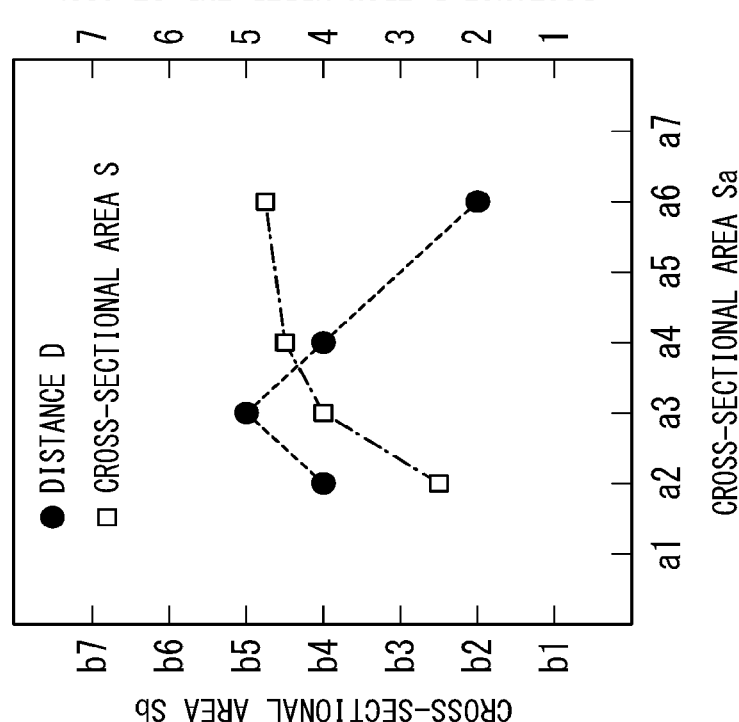
FIG. 7 is a schematic diagram illustrating change in position of the imaging region when respective electric currents to be applied to two superconducting coils are changed.
Figure 7:
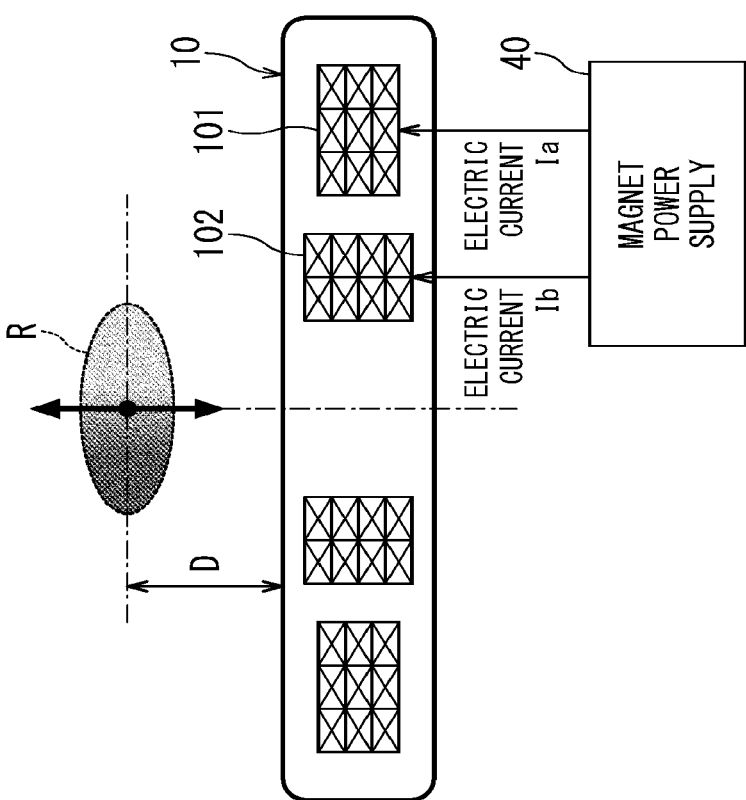

FIG. 7 schematically illustrates change in position of the imaging region R when parameters such as the electric current of the magnet power supply and the cross-sectional area of the segment of the superconducting coil are changed, as one case of adjustment of static magnetic field distribution. In order to avoid complication, FIG. 7 illustrates only the partial configuration shown in FIG. 6 with the upper magnet 10 omitted.

In FIG. 7, it is assumed that: the magnet 10 has two superconducting coils 101 and 102; the electric currents to be applied to the superconducting coils 101 and 102 are respectively defined as a current Ia and a current Ib; and the cross-sectional areas of the segments of the superconducting coil 101 and 102 are respectively defined as a cross-sectional area Sa and a cross-sectional area Sb. FIG. 7 schematically illustrates change in position of the imaging region R corresponding to the static magnetic field distribution when the cross-sectional areas Sa and Sb are changed.

In the graph shown on the right side of FIG. 7, combinations of values of the cross-sectional area Sa and the cross-sectional area Sb are indicated by white squares, and positions of the imaging region R corresponding to these combinations are indicated by black circles. The position of the imaging region R is indicated as the distance D from the upper end of the magnet 10 (or superconducting coils 101 and 102) to the center of the imaging region R. As can be seen from this graph, the position of the imaging region R can be changed by changing the values of the cross-sectional areas Sa and Sb.

Instead of changing the cross-sectional areas Sa and Sb, the position of the imaging region R can also be changed by changing the current Ia and the current Ib.

The above description is only one case of the adjustment of the static magnetic field distribution, and the static magnetic field distribution can also be adjusted by adjusting other parameters other than the electric currents from the magnet power supply 40 and the segment cross-sectional areas of the superconducting coils.

By adjusting the static magnetic field distribution as described above, even if the object moves in the imaging space between the two magnets 10, the object can be correctly imaged. Further, the above-described configuration enables imaging adaptable to an arbitrary or free posture of the object.

Incidentally, it should be noted that, in the persistent current mode, various parameters need to be considered in determining the rate of increasing/decreasing the electric currents applied to the superconducting coils 101 to 103, i.e., in determining the temporal change pattern of increasing the electric currents from zero to the predetermined persistent current value and the temporal change pattern of decreasing the electric currents from the predetermined persistent current value to zero during demagnetization.

Also in the control current mode, various parameters need to be considered in determining the temporal change pattern of increasing/decreasing the electric currents applied to the superconducting coils 101 to 103 under the state where the superconducting state is maintained.

Figure 8:
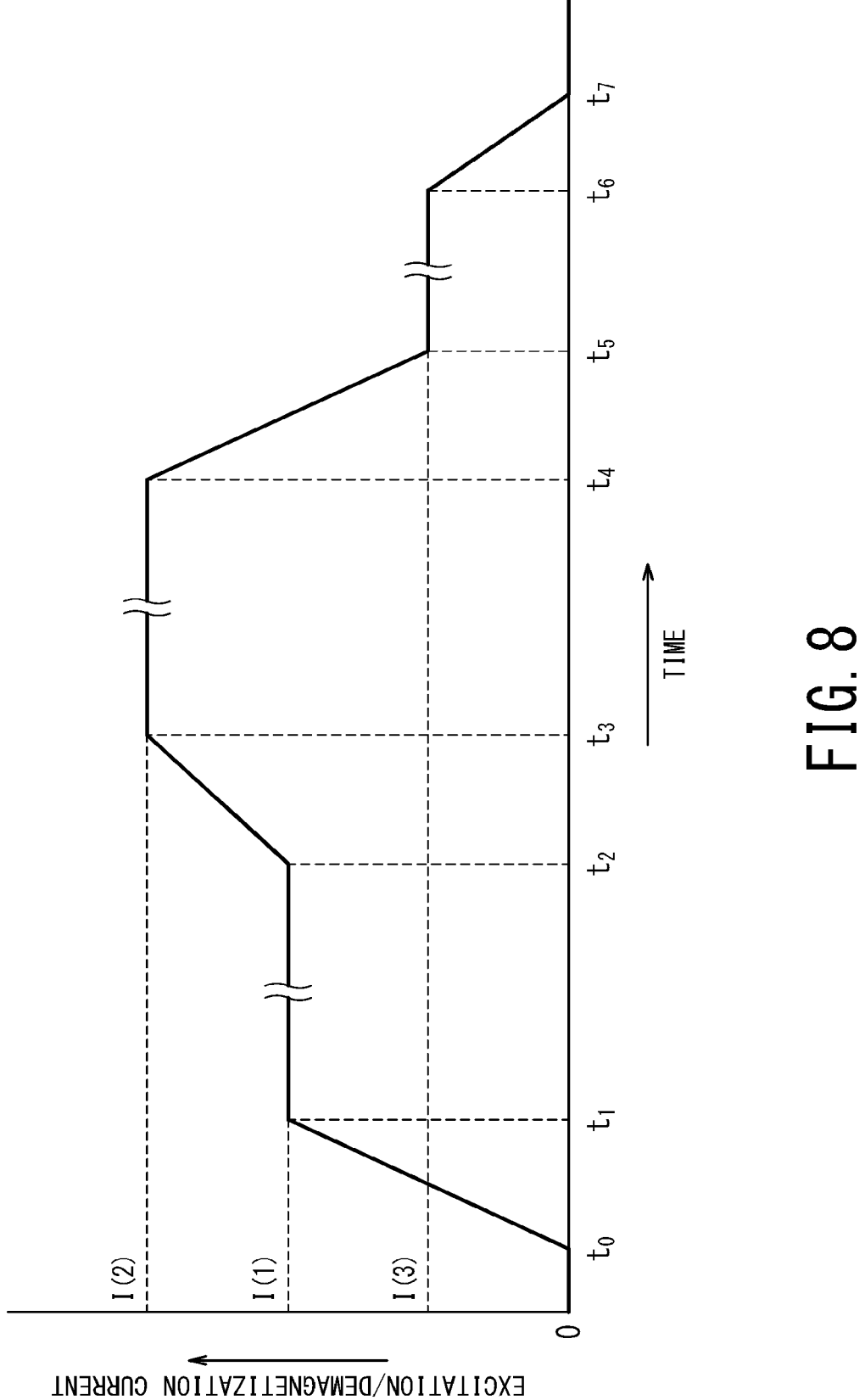
FIG. 8 is a schematic diagram illustrating a temporal change pattern of the electric current in the superconducting coil.

FIG. 8 is a schematic diagram illustrating a temporal change pattern of the electric currents in the superconducting coils 101 to 103 including the excitation period and the demagnetization period.

In the case showing the temporal change pattern of the electric current in FIG. 8, excitation (magnetization) is started at time $t_0$, and then the electric current is: increased from zero to the current $I(1)$ in the period from time to $t_0$ time $t_1$; maintained at the current $I(1)$ in the period from time $t_1$ to time $t_2$; further increased from the current $I(1)$ to the current $I(2)$ in the period from time $t_2$ to time $t_3$; maintained at the current $I(2)$ in the period from time $t_3$ to time $t_4$; decreased from the current $I(2)$ to the current $I(3)$ in the period from time $t_4$ to time $t_5$; maintained at the current $I(3)$ in the period from time $t_5$ to time $t_6$; and decreased from the current $I(3)$ to zero in the period from time $t_6$ to time $t_7$.

The temporal change patterns of the electric currents from the magnet power supply 40 for both cases of exciting the magnets 10 (i.e., increasing the strength of the static magnetic field) and demagnetizing the magnets 10 (i.e., decreasing the strength of the static magnetic field) are determined based on at least one of: the shape of the static magnetic field distribution to be achieved; the strength of the static magnetic field to be achieved; temperatures of respective magnet components such as the superconducting coil 101; an experienced magnetic field of each of the superconducting coil 101 to 103; and a metric representing cooling performance for cooling the superconducting coils 101 to 103.

The temperatures of the respective magnet components such as superconducting coil 101 can be acquired as magnet monitoring information from data of temperature sensors provided adjacent to the respective magnet components such as the superconducting coils 101. In addition, parameters, such as the shape of the static magnetic field distribution to be achieved, the strength of the static magnetic field to be achieved, and the metric representing the cooling performance, can be inputted to the control circuitry 42 in advance. The shape of the static magnetic field distribution to be achieved and the strength of the static magnetic field to be achieved can also be determined based on the imaging conditions that are set by the imaging-condition setting circuit 50.

Second Embodiment

Figure 9:
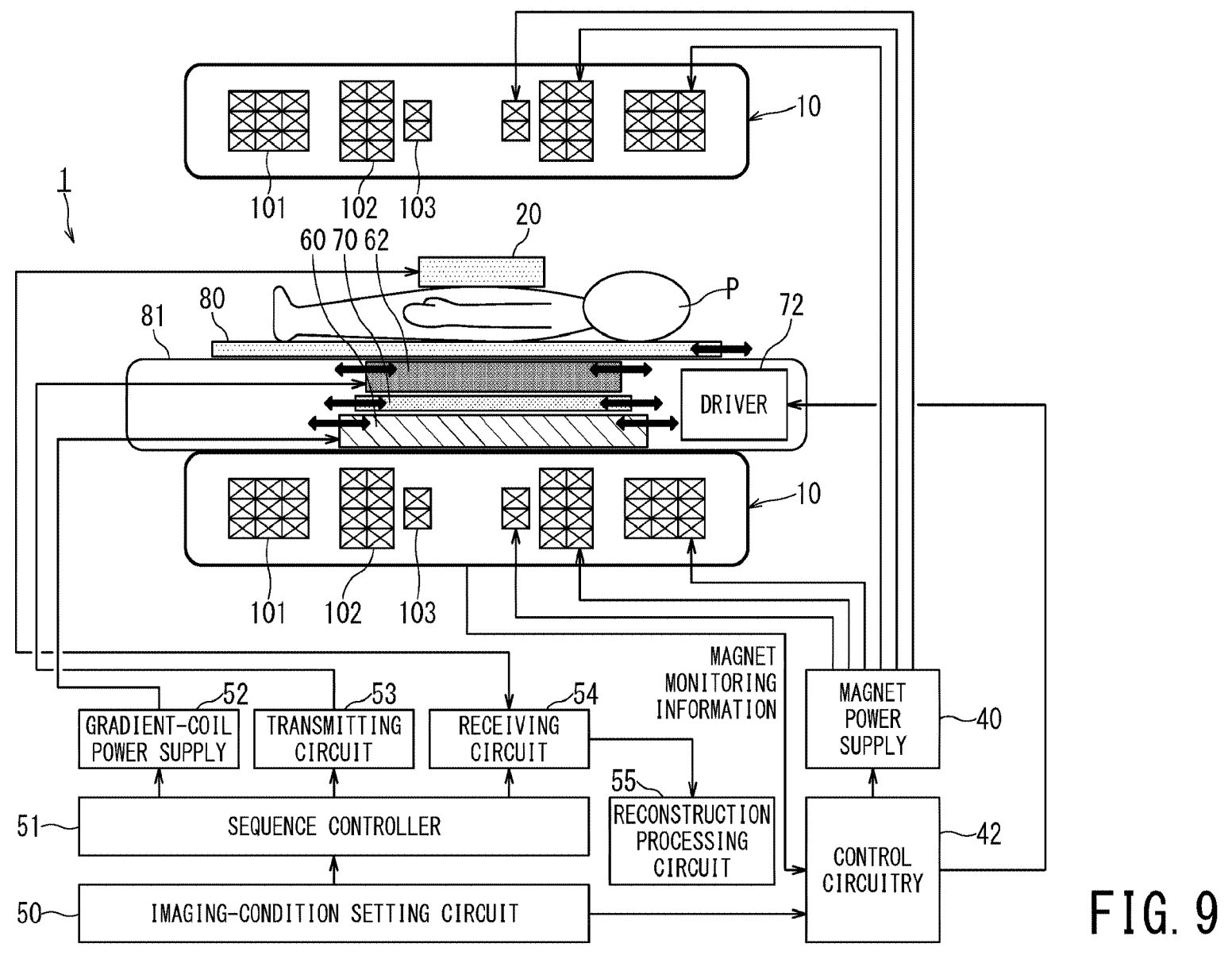

FIG. 9 is a schematic diagram illustrating a configuration of the MRI apparatus 1 according to the second embodiment. The first difference from the first embodiment (FIG. 6) is that the MRI apparatus 1 of the second embodiment has a magnetic material 70 for adjusting the static magnetic field distribution. The magnetic material 70 is a member including a ferromagnetic material such as iron and nickel. The magnetic material 70 is disposed, for example, between one of the magnets 10 and the table 80. Additionally or alternatively, the magnetic material 70 may be provided inside a vacuum vessel called a cryostat. Note that the magnetic material 70 may be configured as a coil.

The magnetic material 70 is moved by a driver 72 along the longitudinal direction and the width direction of the table 80 under the control of the control circuitry 42, for example. Moving the magnetic material 70 enables adjustment of the shape of the static magnetic field distribution and adjustment of the strength of the static magnetic field, and consequently, the size and position of the imaging region R can be adjusted.

The second difference from the first embodiment is that the MRI apparatus 1 of the second embodiment moves at least one of the gradient coil 60, the RF coli 62, and the table 80 relative to the magnets 10. The gradient coil 60, the RF coli 62, and/or the table 80 can be moved along the longitudinal direction and/or the width direction of the table 80 by the driver 72 under the control of the control circuitry 42 similarly to the above-described magnetic material 70, for example. Moving at least one of these components enables adjustment of the shape of the static magnetic field distribution and adjustment of the strength of the static magnetic field, and consequently, the size and position of the imaging region R can be adjusted.

Also in the MRI apparatus 1 of the second embodiment described above, the size and position of the imaging region R can be adjusted, and the object can be correctly imaged in the imaging space between the two magnets 10 even if the object moves. Further, the configuration of the second embodiment enables imaging adaptable to an arbitrary or free posture of the object.

Third Embodiment

The MRI apparatus 1 of the first embodiment (FIG. 6) or the MRI apparatus 1 of the second embodiment (FIG. 9) includes the two magnets 10 facing each other so as to image the object in the space sandwiched between the two magnets 10.

In the MRI apparatus 1 of the third embodiment, only one of the two magnets 10 is provided. For example, the MRI apparatus 1 of the third embodiment can be configured by removing the magnet 10 on the upper side of the table 80 from the configuration of the MRI apparatus 1 of the first or second embodiment shown in FIG. 6 or FIG. 9. In the third embodiment, only the magnet 10 disposed below the table 80 is provided as the static magnetic field magnet. Even in the MRI apparatus 1 of the third embodiment, the effects similar to those of the first and second embodiments can be obtained.

According to at least one embodiment described above, in an open-magnet MRI apparatus, imaging of an object in accordance with a motion and/or a free posture of the object in an imaging space can be achieved.

While certain embodiments have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the scope of the invention as defined by the appended claims.

What is claimed is:

1. An MRI apparatus, comprising:
a static magnet provided with a superconducting coil and configured to generate a static magnetic field having static magnetic field distribution in an open space outside the superconducting coil, the superconducting coil being divided into a plurality of segments, each segment having a superconducting subcoil that is electrically independent of other of the plurality of segments, the plurality of the segments in the superconducting coil being divided into a first group and a second group;
control circuitry configured to adjust the static magnetic field distribution, by having a direction of a first electric current applied to the segments in the first group opposite to a direction of a second electric current applied to the segments in the second group, and by independently controlling a magnitude of the first electric current and a magnitude of the second electric current, so as to adjust at least one of a position of an imaging region of an object and a range of the imaging region of the object; and
a reconstruction processing circuit configured to generate a magnetic resonance image based on magnetic resonance signals emitted from the object that is at least partially placed in the open space outside the superconducting coil.

2. The MRI apparatus according to claim 1, further comprising a magnet power supply configured to apply the electric current to the superconducting coil,
wherein the control circuitry is further configured to control the static magnetic field distribution by a persistent current mode in which the electric current applied to the superconducting coil is increased to a predetermined value and then the electric current continues to flow in the superconducting coil in a state of being disconnected from the magnet power supply.

3. The MRI apparatus according to claim 1, further comprising a magnet power supply configured to apply the electric current to the superconducting coil,
wherein the control circuitry is further configured to control the static magnetic field distribution by adjusting the electric current applied to the superconducting coil under a state where the magnet power supply is connected to the superconducting coil.

4. The MRI apparatus according to claim 1, further comprising an imaging-condition setting circuit configured to set at least one imaging condition, wherein:
the at least one imaging condition comprises the at least one of the position of the imaging region of the object and the range of the imaging region of the object; and
the control circuitry is further configured to adjust the static magnetic field distribution based on the at least one imaging condition being set by the imaging-condition setting circuit.

5. The MRI apparatus according to claim 1, further comprising a magnet power supply configured to apply an electric current to the superconducting coil,
wherein the control circuitry is further configured to determine temporal change patterns of the electric current from the magnet power supply for both cases of magnetizing the static magnet and demagnetizing the static magnet based on at least one of:
the static magnetic field distribution;
a strength of the static magnetic field;
a temperature of the superconducting coil;
an experienced magnetic field of the superconducting coil; and
a cooling performance of the superconducting coil.

6. The MRI apparatus according to claim 1, further comprising:
a magnetic material configured to adjust the static magnetic field distribution; and
a driver configured to move the magnetic material,
wherein the control circuitry is further configured to adjust the static magnetic field distribution by controlling the driver in such a manner that the magnetic material is moved relative to the static magnet.

7. The MRI apparatus according to claim 1, further comprising:
a gradient coil configured to apply a gradient magnetic field to the object;
an RF coil configured to apply a radio-frequency magnetic field to the object;
a table configured to support the object; and a driver configured to move at least one of the gradient coil, the RF coil, and the table,
wherein the control circuitry is further configured to adjust the static magnetic field distribution by controlling the driver in such a manner that the at least one of the gradient coil, the RF coil, and the table is moved relative to the static magnet.

8. The MRI apparatus according to claim 1, wherein the control circuitry is further configured to adjust the magnetic field distribution so as to adjust the position of the imaging region of the object.

9. An MRI apparatus, comprising:
a static magnet provided with a superconducting coil and configured to generate a static magnetic field having static magnetic field distribution in an open space outside the superconducting coil, the superconducting coil being divided into a plurality of segments, each segment having a superconducting subcoil that is electrically independent of other of the plurality of segments, the plurality of the segments in the superconducting coil being divided into a first group and a second group;
a magnet power supply configured to apply an electric current to the superconducting coil;
control circuitry configured to adjust the static magnetic field distribution by independently controlling the electric current applied to the superconducting coil for each segment so as to adjust at least one of a position of an imaging region of an object and a range of the imaging region of the object: wherein the control circuitry is further configured to
control the static magnetic field distribution relating to the segments in the first group by having a persistent current mode in which an electric current applied to the first superconducting coil is increased to a predetermined value and then the electric current continues to flow in the segments in the first group in a state of being disconnected from the magnet power supply; and
control the static magnetic field distribution relating to the segments in the second group by adjusting an electric current applied to the segments in the second group under a state where the magnet power supply is connected to the segments in the second group; and
a reconstruction processing circuit configured to generate a magnetic resonance image based on magnetic resonance signals emitted from the object that is at least partially placed in the open space outside the superconducting coil.

10. The MRI apparatus according to claim 9, further comprising an imaging-condition setting circuit configured to set at least one imaging condition, and wherein:
the at least one imaging condition comprises the at least one of the position of the imaging region of the object and the range of the imaging region of the object; and
the control circuitry is further configured to adjust the static magnetic field distribution based on the at least one imaging condition being set by the imaging-condition setting circuit.

11. The MRI apparatus according to claim 9, further comprising a magnet power supply configured to apply an electric current to the superconducting coil, and
wherein the control circuitry is further configured to determine temporal change patterns of the electric current from the magnet power supply for both cases of magnetizing
the static magnet and demagnetizing the static magnet based on at least one of:
the static magnetic field distribution;
a strength of the static magnetic field;
a temperature of the superconducting coil;
an experienced magnetic field of the superconducting coil; and
a cooling performance of the superconducting coil.

12. The MRI apparatus of claim 9, further comprising:
a magnetic material configured to adjust the static magnetic field distribution; and
a driver configured to move the magnetic material,
wherein the control circuitry is further configured to adjust the static magnetic field distribution by controlling the driver in such a manner that the magnetic material is moved relative to the static magnet.

13. The MRI apparatus of claim 9, further comprising:
a gradient coil configured to apply a gradient magnetic field to the object;
an RF coil configured to apply a radio-frequency magnetic field to the object;
a table configured to support the object; and
a driver configured to move at least one of the gradient coil, the RF coil, and the table,
wherein the control circuitry is further configured to adjust the static magnetic field distribution by controlling the driver in such a manner that the at least one of the gradient coil, the RF coil, and the table is moved relative to the static magnet.

* * * * *